(12) United States Patent
Yun et al.

(10) Patent No.: US 8,969,874 B2
(45) Date of Patent: Mar. 3, 2015

(54) ORGANIC LIGHT-EMITTING DISPLAY APPARATUS

(75) Inventors: Jung-I Yun, Yongin (KR); Sang-Min Hong, Yongin (KR); Sung-Joo Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 48 days.

(21) Appl. No.: 13/352,938

(22) Filed: Jan. 18, 2012

(65) Prior Publication Data

US 2012/0193627 A1 Aug. 2, 2012

(30) Foreign Application Priority Data

Feb. 1, 2011 (KR) .................. 10-2011-0010302

(51) Int. Cl.
*H01L 29/10* (2006.01)
*H01L 29/04* (2006.01)
*H01L 31/00* (2006.01)
*H01L 27/32* (2006.01)
*H01L 51/52* (2006.01)

(52) U.S. Cl.
CPC ........ *H01L 27/3258* (2013.01); *H01L 51/5209* (2013.01)
USPC .................. 257/59; 257/72; 257/E29.119

(58) Field of Classification Search
USPC ........................................... 257/59
See application file for complete search history.

(56) References Cited

U.S. PATENT DOCUMENTS

| | | | |
|---|---|---|---|
| 2005/0024305 A1* | 2/2005 | Park | 345/82 |
| 2008/0121886 A1* | 5/2008 | Shin | 257/59 |
| 2009/0009865 A1* | 1/2009 | Nishida et al. | 359/486 |
| 2009/0039773 A1* | 2/2009 | Jun et al. | 313/504 |
| 2009/0309493 A1 | 12/2009 | Seo | |
| 2010/0073272 A1* | 3/2010 | Yamazaki et al. | 345/90 |
| 2010/0300862 A1* | 12/2010 | Tamura et al. | 200/600 |
| 2011/0057208 A1* | 3/2011 | Jeon et al. | 257/88 |
| 2011/0121301 A1 | 5/2011 | Kim et al. | |
| 2012/0032178 A1* | 2/2012 | Imai et al. | 257/59 |
| 2012/0146030 A1* | 6/2012 | You et al. | 257/59 |

FOREIGN PATENT DOCUMENTS

| | | |
|---|---|---|
| KR | 10-0611161 | 8/2006 |
| KR | 10-2009-0129135 | 12/2009 |
| KR | 10-2011-0058407 | 6/2011 |

* cited by examiner

*Primary Examiner* — Matthew Landau
*Assistant Examiner* — Igwe U Anya
(74) *Attorney, Agent, or Firm* — Robert E. Bushnell, Esq.

(57) ABSTRACT

An organic light-emitting display apparatus with improved electric properties comprises: a substrate; an insulation layer which is formed on the substrate, and which includes a penetration hole; a first electrode which is formed on the insulation layer; an intermediate layer which is formed on the first electrode, and which includes an organic light-emitting layer; a second electrode which is formed on the intermediate layer; and a fixing member which is formed in the penetration hole, and which contacts the first electrode.

19 Claims, 3 Drawing Sheets

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 1$^{st}$ of Feb. 2011 and there duly assigned Serial No. 10-2011-0010302.

BACKGROUND OF THE INVENTION

1. Field of the Invention

The present invention relates to an organic light-emitting display apparatus, and more particularly, to an organic light-emitting display apparatus with improved electric properties.

2. Description of the Related Art

Display apparatuses are being replaced with portable slim type flat panel display apparatuses. Among various flat panel display apparatuses, an organic light-emitting display apparatus is a self-luminescent type display apparatus having wide viewing angles, excellent contrast, and short response times. Therefore, the organic light-emitting display apparatus is being focused as a next-generation display apparatus.

An organic light-emitting display apparatus includes an intermediate layer, a first electrode, and a second electrode. The intermediate layer includes an organic light-emitting layer, and when voltages are applied to the first and second electrodes, visible rays are generated by the organic light-emitting layer.

In this regard, the first electrode is not uniformly formed throughout the organic light-emitting display apparatus. Particularly, the first electrode is formed as a thin film, and thus, the first electrode may peel off from components therebelow.

As a result, there is a limit when it comes to embodying an organic light-emitting display apparatus with stable and efficient electric properties.

SUMMARY OF THE INVENTION

The present invention provides an organic light-emitting display apparatus, the electric properties of which may be easily improved.

According to an aspect of the present invention, an organic light-emitting display apparatus comprises: a substrate; an insulation layer which is formed on the substrate, and which includes a penetration hole; a first electrode which is formed on the insulation layer; an intermediate layer which is formed on the first electrode, and which includes an organic light-emitting layer; a second electrode which is formed on the intermediate layer; and a fixing member which is formed in the penetration hole, and which contacts the first electrode.

The fixing member may be formed of the same material as the first electrode.

A plurality of penetration holes may be formed, and the fixing member may be formed in the plurality of penetration holes so as to contact the first electrode.

The fixing member may be arranged at a predetermined region from among regions corresponding to edges of the first electrode.

The organic light-emitting display apparatus may further include a supporting member which is formed between the substrate and the insulation layer so as to correspond to at least the penetration hole, and which contacts the fixing member.

The organic light-emitting display apparatus may further include a thin-film transistor (TFT) which is formed between the substrate and the insulation layer, and which includes an active layer, a gate electrode insulated from the active layer, a source electrode, and a drain electrode. The insulation layer may includes a via hole, and the drain electrode and the first electrode may be electrically connected to each other via the via hole.

The via hole and the penetration hole may be separated from each other.

The fixing member may be separated from the source electrode and the drain electrode.

The organic light-emitting display apparatus may further include a supporting member which is formed between the substrate and the insulation layer so as to correspond to at least the penetration hole, and which contacts the fixing member, wherein the supporting member is formed of the same material as the source electrode or the drain electrode.

The supporting member may be separate from the source electrode and the drain electrode.

The organic light-emitting display apparatus may further include a pixel-defining layer which is arranged on the insulation layer, and which includes an opening formed to expose the first electrode, wherein the intermediate layer may be formed on the first electrode exposed by the opening.

The first electrode may be separate from internal surfaces of the opening.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
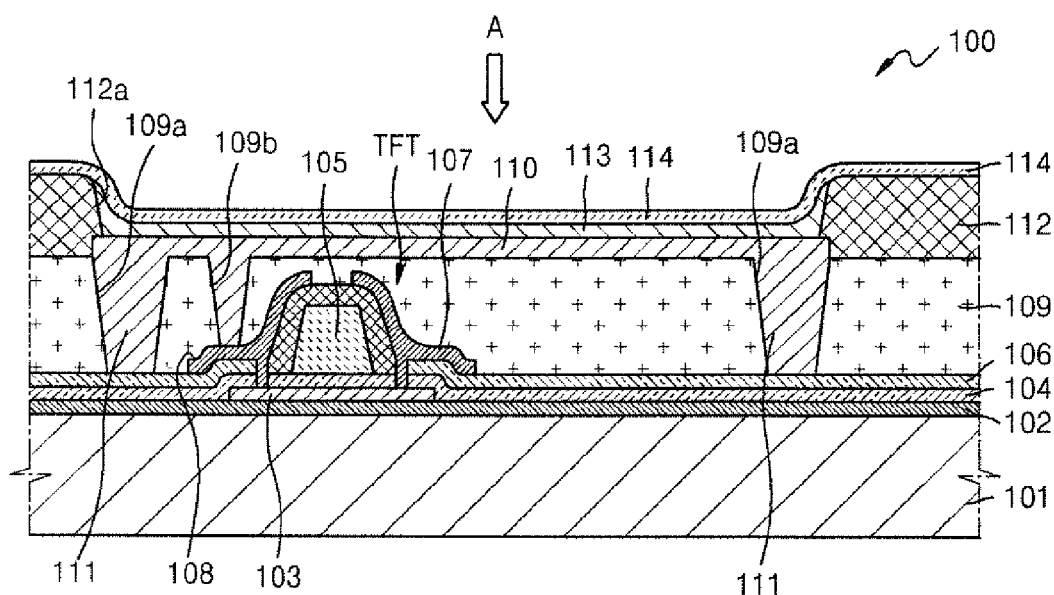
FIG. 1 is a schematic sectional view of an organic light-emitting display apparatus according to an embodiment of the present invention.

Hereinafter, the present invention will be described in detail by explaining preferred embodiments of the invention with reference to the attached drawings. Like reference numerals in the drawings denote like elements.

Figure 2:
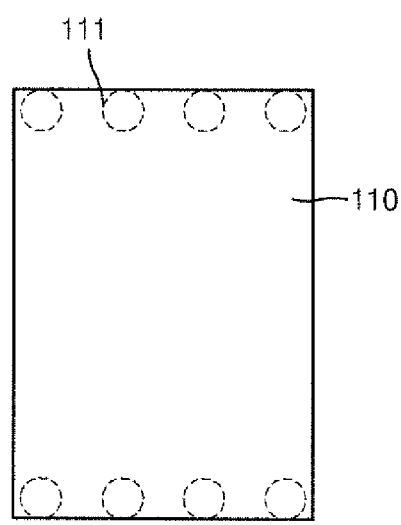
FIG. 2 is a schematic plan view of the organic light-emitting display apparatus of FIG. 1, viewed in the direction A of FIG. 1.

FIG. 1 is a schematic sectional view of an organic light-emitting display apparatus according to an embodiment of the present invention, and FIG. 2 is a schematic plan view of the organic light-emitting display apparatus, viewed in the direction A of FIG. 1. For convenience of explanation, FIG. 2 only shows a first electrode and a fixing member of the organic light-emitting display apparatus of FIG. 1.

Referring to FIGS. 1 and 2, the organic light-emitting display apparatus 100 includes a substrate 101, an insulation layer 109, a thin-film transistor (TFT), the fixing member 111, the first electrode 110, an intermediate layer 113, and a second electrode 114. The TFT includes an active layer 103, a gate electrode 105, a source electrode 107, and a drain electrode 108.

Detailed descriptions of each of the components will be provided below.

The substrate 101 may be formed of an $SiO_2$-based transparent glass. However, the present invention is not limited thereto, and the substrate 101 may also be formed of a transparent plastic material. In this regard, the substrate 101 may be formed of one or more selected from among various organic materials. Furthermore, the substrate 101 may also be formed of a metal thin film.

A buffer layer 102 is formed on the substrate 101. The buffer layer 102 may contain $SiO_2$ or $SiN_x$. The buffer layer 102 provides a flat surface above the substrate 101, and protects the substrate 101 from moisture and impurities.

The active layer 103 has a predetermined pattern, and is formed on the buffer layer 102. The active layer 103 may be formed of an inorganic semiconductor or an organic semiconductor, such as amorphous silicon or polysilicon, and includes a source region, a drain region, and a channel region. The source region and the drain region of the active layer 103 may be formed of amorphous silicon or polysilicon, and may thereafter be doped with a Group III impurity or a Group V impurity.

A gate insulation layer 104 is formed on the active layer 103, and the gate electrode 105 is formed on a predetermined region of the top surface of the gate insulation layer 104. The gate insulation layer 104 is for insulating the active layer 103 and the gate electrode 105 from each other, and may be formed of an organic material or an inorganic material, such as $SiN_x$ and $SiO_2$.

The gate electrode 105 may be formed of a metal, such as Au, Ag, Cu, Ni, Pt, Pd, Al, Mo, etc., or a metal alloy, such as Al:Nd, Mo:W alloy, etc. However, the present invention is not limited thereto, and any of various materials may be used in consideration of adhesiveness, planarity, electric resistance, processibility, etc.

An interlayer insulation layer 106 is formed on the gate electrode 105. The interlayer insulation layer 106 and the gate insulation layer 104 are formed so as to expose the source region and the drain region of the active layer 103, and a source electrode 107 and a drain electrode 108 are formed so as to contact the exposed source region and drain region of the active layer 103, respectively.

Each of the source electrode 107 and the drain electrode 108 may be formed of Au, Pd, Pt, Ni, Rh, Ru, Ir, Os, or an alloy of two or more metals, such as Al, Mo, Al:Nd alloy, MoW alloy, etc. However, the present invention is not limited thereto.

The insulation layer 109 is formed on the TFT. In detail, the insulation layer 109 is formed so as to cover the source electrode 107 and the drain electrode 108. The insulation layer 109 may be a passivation layer for protecting the TFT, or it may be a planarizing layer for planarizing the top surface of the TFT.

The insulation layer 109 may be formed of any of various insulation materials. In detail, the insulation layer 109 may be formed of an organic insulation material or an inorganic insulation material, or it may be formed of a composite material of an organic insulation material and an inorganic insulation material.

The insulation layer 109 includes a via hole 109b formed so as to expose the drain electrode 108, and a first electrode 110 is formed so as to be connected to the drain electrode 108 exposed by the via hole 109b.

The insulation layer 109 includes a penetration hole 109a in which a fixing member 111 is arranged. The fixing member 111 is formed so as to contact the first electrode 110. The number of fixing members 111 is one or more. A plurality of the fixing members 111 may be formed.

Furthermore, the penetration hole 109a is separated from the via hole 109b, and thus the fixing member 111 is separated from the source electrode 107 and the drain electrode 108.

The fixing member 111 fixes first electrode 110 to the insulation layer 109. In other words, the fixing member 111 prevents the first electrode 110 from peeling off from the insulation layer 109. Particularly, since the fixing member 111 is arranged in the penetration hole 109a having a predetermined depth, the fixing member 111 is firmly fixed to the insulation layer 109 through the penetration hole 109a, and thus the fixing member 111 effectively prevents the first electrode 110 from peeling off from the insulation layer 109.

The first electrode 110 is likely to peel off from the insulation layer 109 at edges of the first electrode 110. As shown in FIG. 2, edges of the first electrode 110 may be prevented from peeling off from the insulation layer 109 by forming the fixing member 111 so as to correspond to the edges of the first electrode 110.

Furthermore, as the area in which the fixing member 111 and the first electrode 110 contact each other increases, the first electrode 110 may be more effectively prevented from peeling off. However, if the size of the fixing member 111 increases in a lateral direction, the fixing member 111 may contact the source electrode 107 or the drain electrode 108, and thus the fixing member 111 is formed in a suitable size so as to be separate from the source electrode 107 and the drain electrode 108.

Although FIG. 2 shows that the fixing member 111 is formed at two opposite edges of the first electrode 110 facing each other, the present invention is not limited thereto, and the fixing member 111 may be formed so as to correspond to the four edges of the first electrode 110.

The fixing member 111 may be formed of the same material as the first electrode 110. If the fixing member 111 and the first electrode 110 are formed of the same material, adhesiveness between the fixing member 111 and the first electrode 110 increases, and thus the effect of preventing the first electrode 110 from being peeled off increases. Furthermore, the first electrode 110 and the fixing member 111 may be simultaneously patterned using a mask.

A pixel-defining layer 112 is formed on the first electrode 110 by using an insulation material. The pixel-defining layer 112 includes an opening 112a for exposing a predetermined portion of the first electrode 110. An intermediate layer 113 is formed on the exposed portion of the first electrode 110. Next, the second electrode 114 is formed so as to be connected to the intermediate layer 113.

The intermediate layer 113 includes an organic light-emitting layer, and when voltages are applied to the first electrode 110 and the second electrode 114, the organic light-emitting layer generates visible rays.

A sealing member (not shown) may be arranged on the second electrode 114. The sealing member (not shown) is formed to protect the intermediate layer 113 and other layers from external moisture and oxygen. The sealing member (not shown) is formed of a transparent material. In this regard, the sealing member (not shown) may be formed of glass or a plastic material, or it may have a structure in which a plurality of organic materials and a plurality of inorganic materials are stacked.

In the organic light-emitting display apparatus 100 according to the present embodiment, the insulation layer 109 includes the penetration hole 109a, and the fixing member 111 is formed in the penetration hole 109a so as to contact the first electrode 110. The fixing member 111 fixes the first electrode 110. In other words, the fixing member 111 prevents the first electrode 110 from peeling off from the insulation layer 109.

Particularly, the fixing member 111 is formed of the same material as first electrode 110 so as to improve the adhesiveness between the fixing member 111 and the first electrode 110, and thus the first electrode 110 is more effectively fixed to the insulation layer 109, and is prevented from peeling off from the insulation layer 109.

Furthermore, the fixing member 111 is formed so as to correspond to edges of the first electrode 110, at which the first electrode 110 is likely to peel off, and the effect of preventing the first electrode 110 from peeling off from the insulation layer 109 is improved by forming a plurality of the fixing members 111.

Figure 3:
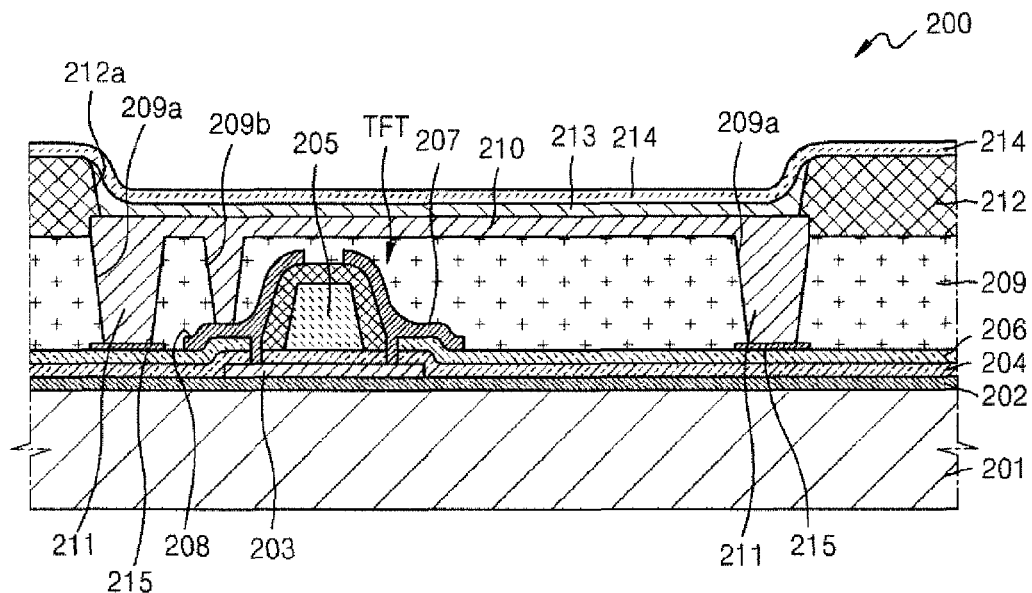
FIG. 3 is a schematic sectional view of an organic light-emitting display apparatus according to another embodiment of the present invention.

FIG. 3 is a schematic sectional view of an organic light-emitting display apparatus according to another embodiment of the present invention.

Referring to FIG. 3, the organic light-emitting display apparatus 200 includes a substrate 201, an insulation layer 209, a TFT, a fixing member 211, a first electrode 210, an intermediate layer 213, a second electrode 214, and a supporting member 215.

The TFT includes an active layer 203, a gate electrode 205, a source electrode 207, and a drain electrode 208.

Detailed descriptions of each of the components will be provided below.

A buffer layer 202 is formed on the substrate 201. The active layer 203 has a predetermined pattern, and is formed on the buffer layer 202. A gate insulation layer 204 is formed on the active layer 203, and the gate electrode 205 is formed on a predetermined region of a top surface of the gate insulation layer 204. An interlayer insulation layer 206 is formed on the gate electrode 205. The interlayer insulation layer 206 and the gate insulation layer 204 are formed so as to expose both a source region and a drain region of the active layer 203, and the source electrode 207 and the drain electrode 208 are formed so as to contact the exposed source region and the exposed drain region, respectively, of the active layer 203.

The supporting member 215 is formed on the interlayer insulation layer 206 so as to be separate from the source electrode 207 and the drain electrode 208. Although the supporting member 215 may be formed of any of various materials, the supporting member 215 may be formed of the same material as the source electrode 207 or the drain electrode 208 for convenience of operation.

The insulation layer 209 is formed on the TFT. In detail, the insulation layer 209 is formed so as to cover the source electrode 207 and the drain electrode 208.

The insulation layer 209 includes a via hole 209b formed to expose the drain electrode 208, and the first electrode 210 is formed so as to contact the drain electrode 208 exposed by the via hole 209b.

The insulation layer 209 includes a penetration hole 209a, and the fixing member 211 is arranged in the penetration hole 209a. The penetration hole 209a is formed so as to correspond to the supporting member 215, and thus the supporting member 215 contacts the fixing member 211.

Furthermore, the fixing member 211 is formed so as to contact the first electrode 210. The number of fixing members 211 is one or more. A plurality of the fixing members 211 may be formed.

Furthermore, the penetration hole 209a is separate from the via hole 209b, and thus the fixing member 211 is separate from the source electrode 207 and the drain electrode 208.

The fixing member 211 may be formed so as to correspond to edges of the first electrode 210. The fixing member 211 may be formed of the same material as the first electrode 210.

A pixel-defining layer 212 is formed on the first electrode 210 by using an insulation material. The pixel-defining layer 212 includes an opening 212a for exposing a predetermined portion of the first electrode 210. The intermediate layer 213 is formed on the exposed portion of the first electrode 210. Next, a second electrode 214 is formed so as to be connected to the intermediate layer 213.

The intermediate layer 213 includes an organic light-emitting layer, and when voltages are applied to the first electrode 210 and the second electrode 214, the organic light-emitting layer generates visible rays.

A sealing member (not shown) may be arranged on the second electrode 214. The sealing member (not shown) is formed to protect the intermediate layer 213 and other layers from external moisture and oxygen. The sealing member (not shown) is formed of a transparent material. In this regard, the sealing member (not shown) may be formed of glass or a plastic material, or it may have a structure in which a plurality of organic materials and a plurality of inorganic materials are stacked.

In the organic light-emitting display apparatus 200 according to the present embodiment, the insulation layer 209 includes the penetration hole 209a, and the fixing member 211 is formed in the penetration hole 209a so as to contact the first electrode 210. The fixing member 211 fixes the first electrode 210. In other words, the fixing member 211 prevents the first electrode 210 from peeling off from the insulation layer 209.

The organic light-emitting display apparatus 200 according to the present embodiment includes the supporting member 215 which is formed so as to correspond to the penetration hole 209a, and which contacts the fixing member 211. The supporting member 215 contacts the fixing member 211 so that the fixing member 211 is stably formed and does not peel off or damage. As a result, the effect of preventing the first electrode 210 from peeling off from the insulation layer 209 is improved.

Furthermore, the fixing member 211 is formed of the same material as first electrode 210 so as to improve the adhesiveness between the fixing member 211 and the first electrode 210, and thus the first electrode 210 is more effectively fixed to the insulation layer 209, and is prevented from peeling off from the insulation layer 209.

Furthermore, the fixing member 211 is formed so as to correspond to edges of the first electrode 210, at which the first electrode 210 is likely to peel off, and the effect of preventing the first electrode 210 from peeling off from the insulation layer 209 is improved by forming a plurality of the fixing members 211.

Figure 4:
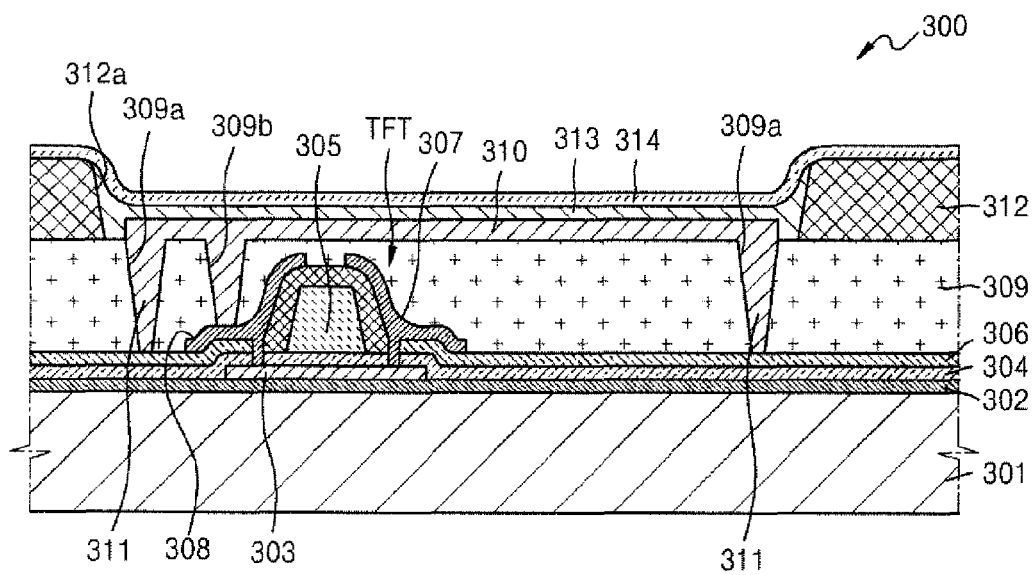
FIG. 4 is a schematic sectional view of an organic light-emitting display apparatus according to another embodiment of the present invention.

FIG. 4 is a schematic sectional view of an organic light-emitting display apparatus according to another embodiment of the present invention.

Referring to FIG. 4, the organic light-emitting display apparatus 300 includes a substrate 301, an insulation layer 309, a TFT, a fixing member 311, a first electrode 310, an intermediate layer 313, and a second electrode 314.

The TFT includes an active layer 303, a gate electrode 305, a source electrode 307, and a drain electrode 308.

Detailed descriptions of each of the components will be provided below.

A buffer layer 302 is formed on the substrate 301. The active layer 303 has a predetermined pattern, and is formed on the buffer layer 302. A gate insulation layer 304 is formed on the active layer 303, and the gate electrode 305 is formed on a predetermined region of the top surface of the gate insulation layer 304. An interlayer insulation layer 306 is formed on the gate electrode 305. The interlayer insulation layer 306 and the gate insulation layer 304 are formed so as to expose both a source region and a drain region of the active layer 303, and the source electrode 307 and the drain electrode 308 are formed so as to contact the exposed source region and the exposed drain region, respectively, of the active layer 303.

The insulation layer 309 is formed on the TFT. In detail, the insulation layer 309 is formed so as to cover the source electrode 307 and the drain electrode 308.

The insulation layer 309 includes a via hole 309b formed so as to expose the drain electrode 308, and the first electrode 310 is formed so as to contact the drain electrode 308 exposed by the via hole 309b.

The insulation layer 309 includes a penetration hole 309a, and the fixing member 311 is arranged in the penetration hole 309a. The fixing member 311 is formed so as to contact the first electrode 310. The number of fixing members 311 is one or more. A plurality of the fixing members 311 may be formed.

Furthermore, the penetration hole 309a is separate from the via hole 309b, and thus the fixing member 311 is separate from the source electrode 307 and the drain electrode 308.

The fixing member 311 may be formed so as to correspond to edges of the first electrode 310. The fixing member 311 may be formed of the same material as the first electrode 310.

A pixel-defining layer 312 is formed on the first electrode 310 by using an insulation material. The pixel-defining layer 312 includes an opening 312a for exposing a predetermined portion of the first electrode 310. In other words, the opening 312a is formed so that the pixel-defining layer 312 does not cover the first electrode 310.

While the organic light-emitting display apparatus 300 is being manufactured or used, the pixel-defining layer 312 may be pressed, and thus the first electrode 310 and the second electrode 312 may contact each other. As a result, a short circuit may occur. Particularly, such a short circuit may likely occur near internal surfaces of the opening 312a, and such a short circuit causes defects, such as dark spots. However, according to the present embodiment, the first electrode 310 is formed so as to be separate from the opening 312a. Therefore, even if the pixel-defining layer 312 is pressed, a short circuit caused by contact between the first electrode 312 and the second electrode 314 near the internal surface of the opening 312a may be effectively prevented.

The intermediate layer 313 is formed on the first electrode 310. Next, a second electrode 314 is formed so as to be connected to the intermediate layer 313.

The intermediate layer 313 includes an organic light-emitting layer, and when voltages are applied to the first electrode 310 and the second electrode 314, the organic light-emitting layer generates visible rays.

A sealing member (not shown) may be arranged on the second electrode 314. The sealing member (not shown) is formed so as to protect the intermediate layer 313 and other layers from external moisture and oxygen. The sealing member (not shown) is formed of a transparent material. In this regard, the sealing member (not shown) may be formed of glass or a plastic material, or it may have a structure in which a plurality of organic materials and a plurality of inorganic materials are stacked.

In the organic light-emitting display apparatus 300 according to the present embodiment, the insulation layer 309 includes the penetration hole 309a, and the fixing member 311 is formed in the penetration hole 309a so as to contact the first electrode 310. The fixing member 311 fixes the first electrode 310. In other words, the fixing member 311 prevents the first electrode 310 from peeling off from the insulation layer 309.

Furthermore, in the organic light-emitting display apparatus 300 according to the present embodiment, the first electrode 310 is formed so as to be separate from the internal surfaces of the opening 312a of the pixel-defining layer 312, thereby preventing a short circuit due to contact between the first electrode 310 and the second electrode 312. Thus, electric defects, such as dark spots caused by a short circuit, may be prevented.

Furthermore, the fixing member 311 is formed of the same material as first electrode 310 so as to improve the adhesiveness between the fixing member 311 and the first electrode 310. Thus, the first electrode 310 is more effectively fixed to the insulation layer 309, and is prevented from peeling off from the insulation layer 309.

Furthermore, the fixing member 311 is formed so as to correspond to edges of the first electrode 310, at which the first electrode 310 is likely to peel off, and the effect of preventing the first electrode 310 from peeling off from the insulation layer 309 is improved by forming a plurality of the fixing members 311.

Figure 5:
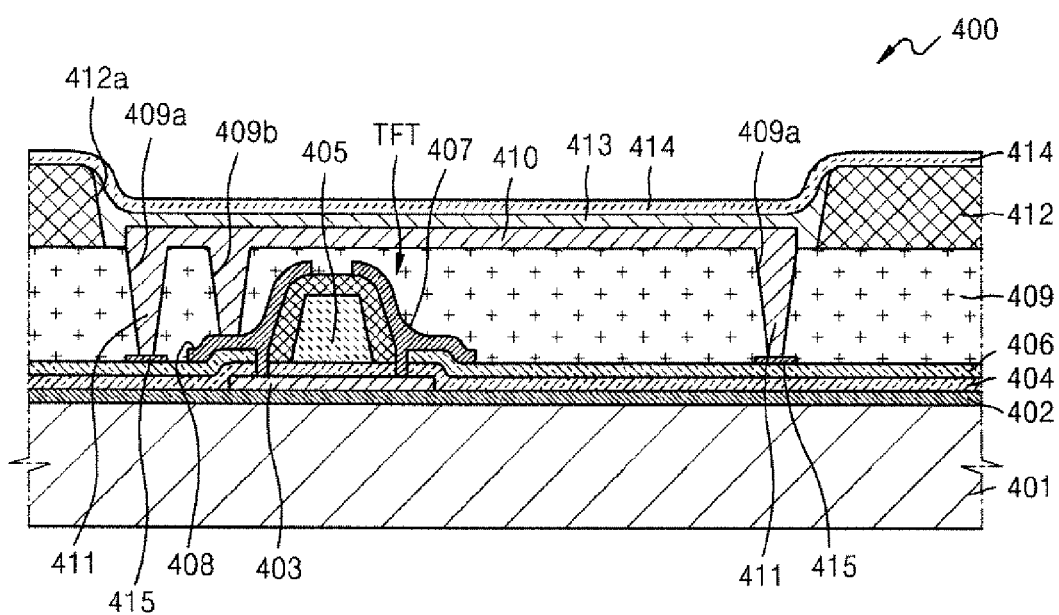
FIG. 5 is a schematic sectional view of an organic light-emitting display apparatus according to another embodiment of the present invention.

FIG. 5 is a schematic sectional view of an organic light-emitting display apparatus according to another embodiment of the present invention.

Referring to FIG. 5, the organic light-emitting display apparatus 400 includes a substrate 401, an insulation layer 409, a TFT, a fixing member 411, a first electrode 410, an intermediate layer 413, a second electrode 414, and a supporting member 415.

The TFT includes an active layer 403, a gate electrode 405, a source electrode 407, and a drain electrode 408.

Detailed descriptions of each of the components will be provided below.

A buffer layer 402 is formed on the substrate 401. The active layer 403 has a predetermined pattern, and is formed on the buffer layer 402. A gate insulation layer 404 is formed on the active layer 403, and the gate electrode 405 is formed on a predetermined region of a top surface of the gate insulation layer 404. An interlayer insulation layer 406 is formed on the gate electrode 405. The interlayer insulation layer 406 and the gate insulation layer 404 are formed so as to expose both a source region and a drain region of the active layer 403, and the source electrode 407 and the drain electrode 408 are formed so as to contact the exposed source region and the exposed drain region, respectively, of the active layer 403.

The supporting member 415 is formed on the interlayer insulation layer 406 so as to be separate from the source electrode 407 and the drain electrode 408. Although the supporting member 415 may be formed of any of various materials, the supporting member 415 may be formed of the same material as the source electrode 407 or the drain electrode 408 for convenience of operation.

The insulation layer 409 is formed on the TFT. In detail, the insulation layer 409 is formed so as to cover the source electrode 407 and the drain electrode 408.

The insulation layer 409 includes a via hole 409b formed so as to expose the drain electrode 408, and the first electrode 410 is formed so as to contact the drain electrode 408 exposed by the via hole 409b.

The insulation layer 409 includes a penetration hole 409a, and the fixing member 411 is formed in the penetration hole 409a. The penetration hole 409a is formed so as to correspond to the supporting member 415, and thus the supporting member 415 contacts the fixing member 411.

Furthermore, the fixing member 411 is formed so as to contact the first electrode 410. The number of fixing members 411 is one or more. A plurality of the fixing members 411 may be formed.

In addition, the penetration hole 409a is separate from the via hole 409b, and thus the fixing member 411 is separate from the source electrode 407 and the drain electrode 408.

The fixing member 411 may be formed so as to correspond to edges of the first electrode 410. The fixing member 411 may be formed of the same material as the first electrode 410.

A pixel-defining layer 412 is formed on the first electrode 410 by using an insulation material. The pixel-defining layer 412 includes an opening 412a for exposing the first electrode 410. The opening 412a is formed so that internal surfaces of the opening 412a is separate from the first electrode 410. In other words, the opening 412a is formed so that the pixel-defining layer 412 does not cover the first electrode 410.

An intermediate layer 413 is formed on the first electrode 410. Next, a second electrode 414 is formed so as to be connected to the intermediate layer 413.

The intermediate layer 413 includes an organic light-emitting layer, and when voltages are applied to the first electrode 410 and the second electrode 414, the organic light-emitting layer generates visible rays.

A sealing member (not shown) may be arranged on the second electrode 414. The sealing member (not shown) is formed so as to protect the intermediate layer 413 and other layers from external moisture and oxygen. The sealing member (not shown) is formed of a transparent material. In this regard, the sealing member (not shown) may be formed of glass or a plastic material, or it may have a structure in which a plurality of organic materials and a plurality of inorganic materials are stacked.

In the organic light-emitting display apparatus 400 according to the present embodiment, the insulation layer 409 includes the penetration hole 409a, and the fixing member 411 is formed in the penetration hole 409a so as to contact the first electrode 410. The fixing member 411 fixes the first electrode 410. In other words, the fixing member 411 prevents the first electrode 410 from peeling off from the insulation layer 409.

Furthermore, in the organic light-emitting display apparatus 400 according to the present embodiment, the first electrode 410 is formed so as to be separate from the internal surfaces of the opening 412a of the pixel-defining layer 412, thereby preventing a short circuit due to contact between the first electrode 410 and the second electrode 412 even if the pixel-defining layer 412 is pressed. Thus, electric defects, such as dark spots caused by a short circuit, may be prevented.

Furthermore, the organic light-emitting display apparatus 400 according to the present embodiment includes the supporting member 415 which is formed so as to correspond to the penetration hole 409a, and which contacts the fixing member 411. The supporting member 415 contacts the fixing member 411 so that the fixing member 411 is stably formed and does not peel off or damage. As a result, the effect of preventing the first electrode 410 from peeling off from the insulation layer 409 is improved.

Furthermore, the fixing member 411 is formed of the same material as first electrode 410 so as to improve the adhesiveness between the fixing member 411 and the first electrode 410. Thus, the first electrode 410 is more effectively fixed to the insulation layer 409, and is prevented from peeling off from the insulation layer 409.

Furthermore, the fixing member 411 is formed so as to correspond to edges of the first electrode 410, at which the first electrode 410 is likely to peel off, and the effect of preventing the first electrode 410 from peeling off from the insulation layer 409 is improved by forming a plurality of the fixing members 411.

Electric properties of an organic light-emitting display apparatus according to the present invention may be easily improved While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
   a substrate;
   an insulation layer formed on the substrate, and including a penetration hole extending completely through the insulation layer and a separate via hole extending completely through the insulation layer;
   a first electrode formed on the insulation layer;
   a thin-film transistor (TFT) formed between the substrate and the insulation layer, and including an active layer, a gate electrode insulated from the active layer, a source electrode, and a drain electrode, the drain electrode and the first electrode being electrically connected to each other via the via hole;
   an intermediate layer formed on the first electrode, and including an organic light-emitting layer;
   a second electrode formed on the intermediate layer; and
   a fixing member formed through the penetration hole and contacting the first electrode.

2. The organic light-emitting display apparatus of claim 1, wherein the fixing member is formed of a same material as the first electrode.

3. The organic light-emitting display apparatus of claim 1, wherein a plurality of the penetration holes are formed, and the fixing member is formed in the plurality of penetration holes so as to contact the first electrode.

4. The organic light-emitting display apparatus of claim 1, wherein the fixing member is arranged at a predetermined region from among regions corresponding to edges of the first electrode.

5. The organic light-emitting display apparatus of claim 1, further comprising a supporting member which is formed between the substrate and the insulation layer so as to correspond to at least the penetration hole, and which contacts the fixing member.

6. The organic light-emitting display apparatus of claim 1, wherein the fixing member is separate from the source electrode and the drain electrode.

7. The organic light-emitting display apparatus of claim 1, further comprising a supporting member which is formed between the substrate and the insulation layer so as to correspond to at least the penetration hole, and which contacts the fixing member; and wherein the supporting member is formed of a same material as one of the source electrode and the drain electrode.

8. The organic light-emitting display apparatus of claim 7, wherein the supporting member is separate from the source electrode and the drain electrode.

9. The organic light-emitting display apparatus of claim 1, further comprising a pixel-defining layer which is arranged on the insulation layer, and which includes an opening formed to expose the first electrode;
   wherein the intermediate layer is formed on the first electrode exposed by the opening.

10. The organic light-emitting display apparatus of claim 9, wherein the first electrode is separate from internal surfaces of the opening.

11. An organic light-emitting display apparatus, comprising:
    a substrate;
    an insulation layer formed on the substrate;
    a plurality of penetration holes extended through the insulation layer to the substrate;
    a first electrode formed on the insulation layer;
    an intermediate layer formed on the first electrode, the intermediate layer including an organic light-emitting layer;
    a second electrode formed on the intermediate layer; and
    fixing members formed through each of the penetration holes, the fixing members being in contact with the first electrode.

12. The organic light-emitting display apparatus of claim 11, the fixing member being formed of a same material as the first electrode.

13. The organic light-emitting display apparatus of claim 11, the fixing members being arranged at opposite ends of the first electrode.

14. The organic light-emitting display apparatus of claim 11, further comprising:
    a thin-film transistor formed between the substrate and the insulation layer, the thin-film transistor having a source electrode, and a drain electrode; and
    a via hole formed through the insulation layer, the first electrode being connected to one of the source and drain electrodes through the via hole.

15. The organic light-emitting display apparatus of claim 11, further comprising a pixel-defining layer which is arranged on the insulation layer, the pixel-defining layer defining an opening through which the first electrode is exposed.

16. The organic light-emitting display apparatus of claim 15, the pixel-defining layer being in contact with the first electrode.

17. The organic light-emitting display apparatus of claim 15, the intermediate layer separating the first electrode from the pixel-defining layer.

18. An organic light-emitting display apparatus, comprising:
    a substrate;
    a plurality of supporting members disposed on the substrate;
    an insulation layer formed on the substrate and the supporting members;
    a plurality of penetration holes extended through the insulation layer to the supporting members;
    a first electrode formed on the insulation layer;
    an intermediate layer formed on the first electrode, the intermediate layer including an organic light-emitting layer;
    a second electrode formed on the intermediate layer; and
    fixing members formed in each of the penetration holes, the fixing members being in contact with both the first electrode and the supporting members.

19. An organic light-emitting display apparatus, comprising:
    a substrate;
    a plurality of supporting members disposed on the substrate;
    an insulation layer formed on the substrate and the supporting members;
    a plurality of penetration holes extended through the insulation layer to the supporting members;
    a first electrode formed on the insulation layer;
    an intermediate layer formed on the first electrode, the intermediate layer including an organic light-emitting layer;
    a second electrode formed on the intermediate layer; and
    fixing members formed in each of the penetration holes, the fixing members being in contact with the supporting members and opposite edges of the first electrode.

* * * * *